United States Patent
Nagasaka et al.

(10) Patent No.: US 7,476,634 B2
(45) Date of Patent: Jan. 13, 2009

(54) YTTRIA SINTERED BODY AND MANUFACTURING METHOD THEREFOR

(75) Inventors: Sachiyuki Nagasaka, Aichi (JP); Keiji Morita, Aichi (JP); Keisuke Watanabe, Aichi (JP)

(73) Assignee: Covalent Materials Corporation, Tokyo (JP)

( * ) Notice: Subject to any disclaimer, the term of this patent is extended or adjusted under 35 U.S.C. 154(b) by 140 days.

(21) Appl. No.: 11/504,102

(22) Filed: Aug. 15, 2006

(65) Prior Publication Data

US 2007/0066478 A1   Mar. 22, 2007

(30) Foreign Application Priority Data

| Aug. 16, 2005 | (JP) | ............................. 2005-235619 |
| Aug. 31, 2005 | (JP) | ............................. 2005-251085 |
| Aug. 11, 2006 | (JP) | ............................. 2006-219550 |

(51) Int. Cl.
*C04B 35/505*   (2006.01)

(52) U.S. Cl. .................................................... 501/152

(58) Field of Classification Search ................. 501/152; 252/515, 521.1

See application file for complete search history.

(56) References Cited

U.S. PATENT DOCUMENTS

| 5,590,392 | A |   | 12/1996 | Ishiwata et al. |
| 5,606,141 | A | * | 2/1997 | Leichtfried ................. 75/235 |
| 6,410,471 | B2 | * | 6/2002 | Kaneyoshi ................. 501/152 |
| 6,834,613 | B1 | * | 12/2004 | Miyazaki et al. ........ 118/723 R |

FOREIGN PATENT DOCUMENTS

| JP | 7-233434 A | 9/1995 |
| JP | 2002-15619 A | 1/2002 |
| JP | 2003-234300 A | 8/2003 |

\* cited by examiner

*Primary Examiner*—Karl E Group
(74) *Attorney, Agent, or Firm*—Foley & Lardner LLP

(57) ABSTRACT

To provide a yttria sintered body having an excellent corrosion resistance to halogen-based corrosive gases and plasma and an excellent thermal shock resistance, and adapted for use as a component member in manufacturing apparatuses for semiconductor and liquid crystal devices, particularly in a plasma process apparatus. A yttria sintered body including tungsten of an average particle size of 3 μm or less dispersed in the yttria so that a ratio of the tungsten relative to the yttria is ranging from 1 to 50% in terms of weight, and having an open pore rate of 0.2% or less and a thermal shock resistance by water submersion method of 200° C. or larger.

4 Claims, No Drawings

YTTRIA SINTERED BODY AND MANUFACTURING METHOD THEREFOR

BACKGROUND OF THE INVENTION

1. Field of the Invention

The present invention relates to an yttria sintered body, having an excellent corrosion resistance to halogen-based corrosive gases and plasma, and adapted for use in a plasma process apparatus for manufacturing semiconductors and liquid crystal devices.

2. Description of the Background Art

In semiconductor manufacturing apparatuses, component members formed by silicon, quartz glass or silicon carbide are frequently utilized (see Japanese Patent Unexamined Publication JP-A-2002-15619). Such materials, being principally constituted of Si, C and O which are constituent elements of a semiconductor wafer or the like to be manufactured and being obtainable with a high purity. Thus, there is an advantage of not contaminating the wafer even when the component contacts with the wafer or even when a vapor of the constituent evaporates from such component members.

However, such materials involve a drawback of undergoing a significant corrosion by a halogen-based gas, particularly a fluorine-based gas, and is therefore unsuitable as a member for an apparatus to be used in an etching process, a CVD film forming process or an ashing process for removing a resist material, principally executed by a plasma process utilizing a highly reactive halogen-based corrosive gas such as fluorine or chlorine.

Therefore, for members to be exposed to halogen plasma in such processes, ceramics such as highly pure alumina, aluminum nitride, yttria or YAG are utilized.

Among these materials, yttria is attracting attention because of an excellent plasma resistance thereof.

For example, Japanese Patent Unexamined Publication JP-A-2003-234300 discloses that a porous sintered body of yttria ceramics is usable in a plasma process apparatus.

On the other hand, for use as a component member in a plasma process apparatus, a material, having an excellent plasma resistance and also having a low volume resistivity or a volume resistivity arbitrarily controllable according to the condition of use, has been desired.

For reducing the volume resistivity of such ceramics, for example, it is conceivable "to add to alumina, a powder of a compound containing an alkali metal or a transition metal, or a powder of titanium oxide", or "to add, to a high-resistance ceramics as described above, a metal oxide such as titanium oxide or tungsten oxide, a metal nitride such as titanium nitride, or a metal carbide such as titanium carbide, tungsten carbide or silicon carbide, showing an conductivity".

JP-A-7-233434 discloses a corrosion resistant material in which particles of a metal oxide such as yttria are dispersed in a proportion of 50 vol % or less in a matrix of a high-melting metal such as tungsten. Such material is intended, as a material resistant to corrosion by a rare earth metal such as yttrium in a molten state, for a component member such as a crucible, coming into contact with such molten rare earth metal.

The aforementioned method, when used in reducing the volume resistivity of ceramics of a high plasma resistance such as high purity alumina, aluminum nitride, yttria or YAG, results in a deterioration of the plasma resistance and in an inclusion of impurity elements leading to a contamination of the wafer, and cannot therefore be considered as a practically acceptable method.

Also in the member formed by the ceramics as mentioned above, the volume resistivity is also influenced by a pore rate of the material, and a dense sintered body is desirable for reducing the volume resistivity. For this reason, a sintering process with a special method under a high-temperature environment such as hot pressing (HP) or hot isostatic pressing (HIP) is required. However, the manufacture of a large-sized member matching the increasing diameter of the wafer becomes very costly.

Yttria ceramics, though excellent in the plasma resistance as described above, there are drawbacks in comparison with other ceramics such as alumina, of a lower strength, a lower thermal shock resistance and a possibility of breakage by a thermal stress depending on temperature conditions, when employed as a component member of a semiconductor manufacturing apparatus. More specifically, it can be used without difficulty under a temperature of about 50° C., but shows a high probability of breakage when used in a high temperature range of 200° C. or higher.

Therefore, for use as a component member of a plasma process apparatus in semiconductor manufacture or the like, a yttria sintered body capable of showing a thermal shock resistance usable under a high temperature condition of 200° C. or higher, without deteriorating the excellent plasma resistance of yttria, is being desired.

SUMMARY OF THE INVENTION

The present invention has been made in order to solve the technical problems described above, and one of objects thereof is to provide a yttria sintered body having an excellent corrosion resistance to halogen-based corrosive gases and plasma and an excellent thermal shock resistance, and adapted for use as a component member in an apparatus for producing semiconductor and liquid crystal devices, particularly in a plasma process apparatus, and a manufacturing method therefor.

According to one of aspects of the invention, there is provided a yttria sintered body comprising yttria, and tungsten dispersed in the yttria in such a manner that a ratio of the tungsten relative to the yttria is ranging from 1 to 50% in terms of weight,
  wherein an open pore rate of the yttria sintered body is 0.2% or less and
  a thermal shock resistance of the yttria sintered body is 200° C. or more in a water submersion method.

Such sintered body is capable of improving the thermal shock resistance of yttria sintered body without deteriorating the excellent plasma resistance of yttria, and is advantageously usable as a component member of an apparatus in a halogen plasma process even under a high temperature condition of 200° C. or higher.

The tungsten preferably has an average particle size of 3 µm or less.

An average particles size of the tungsten as an additive of 3 µm or less easily allows to obtain a denser sintered body and to control the open pore rate at 0.2% or less. Accordingly, when the yttria ceramics is employed as a component member of a halogen plasma process apparatus, the generation of particles derived from the sintered body is suppressed.

As described above, the yttria sintered body of the invention is a material having an excellent corrosion resistance to halogen-based corrosive gases and plasma, an excellent thermal shock resistance, and adapted for use in a manufacturing process for semiconductor and liquid crystal devices, particularly as a component member of a plasma process apparatus.

Also a member formed by the yttria sintered body allows to suppress generation of particles even in a halogen plasma process, and thus to contribute to an improvement in a production yield of semiconductor devices or the like to be produced in subsequent steps.

According to one of aspect of the present invention, there is provided a yttria sintered body comprising yttria and tungsten dispersed in the yttria in such a manner that a ratio of the tungsten relative to the yttria is ranging from 1 to 50% in terms of weight, wherein an open pore rate of the yttria sintered body is 0.2% or less.

Such sintered body, employed as a member in an apparatus for a halogen plasma process, allows to suppress generation of particles caused by an electrostatic charging of the ceramics member, and in an etching of a wafer or the like, allows to attain a uniform etching rate over the wafer surface.

The yttria sintered body preferably has a volume resistivity of $10^6$ Ω·cm or more and $10^{13}$ Ω·cm or less at temperature of 20 to 400° C.

The yttria sintered body having a volume resistivity within the range above is more effective in suppressing the generation of particles and in attaining the uniform etching rate, as described above.

According to one of aspect of the present invention, there is provided a manufacturing method for a yttria sintered body comprising the steps of:

adding tungsten powder to yttria powder in such a manner that a ratio of the tungsten powder relative to the yttria powder is ranging from 1 to 50% in terms of weight, and sintering at a temperature of from 1700 to 2000° C. in a reducing atmosphere or in vacuum so as to obtain an yttria sintered body having a volume resistivity of $10^6$ Ω·cm or more and $10^{13}$ Ω·cm or less at temperature of from 20 to 400° C.

Such producing method allows obtaining an yttria sintered body in advantageous manner.

As described above, the yttria sintered body of the invention is a material having an excellent corrosion resistance to halogen-based corrosive gases and plasma, and adapted for use in a manufacturing process for semiconductor and liquid crystal devices, particularly as a component member of a plasma process apparatus.

Also a member formed by the yttria sintered body allows to suppress generation of particles even in a halogen plasma process, and thus to contribute to an improvement in a production yield of semiconductor chips or the like to be produced in subsequent steps.

Also the producing method of the invention allows obtaining the yttria sintered body of the invention in advantageous manner.

Note that the ratio of the tungsten is defined such that when there is s(g) of yttria and t(g) of tungsten, the ratio of the tungsten is determined as t/s %.

DETAILED DESCRIPTION OF THE PREFERRED EMBODIMENTS

In the following, the present invention will be clarified in further details.

The yttria sintered body of the present invention is characterized in including tungsten, dispersed in the yttria in such a manner that a ratio of the tungsten relative to the yttria is ranging from 1 to 50% in terms of weight, and having an open pore rate equal to or less than 0.2% and a thermal shock resistance in a water submersion method equal to or larger than 200° C.

Accordingly, adding tungsten having high heat resistant metal to yttria which itself has a superior plasma resistance allows improving the thermal shock resistance of the yttria sintered body.

Thus the yttria sintered body of the present invention has an excellent resistance to corrosion by halogen plasma derived from fluorine or chlorine. Further, the thermal shock resistance of the yttria sintered body is adjustable by the amount of addition of the highly heat resistant tungsten metal.

Therefore, as the additive to yttria, a substance detrimentally affecting the excellent plasma resistance of yttria itself or a substance containing an element constituting a source of contamination in the semiconductor manufacture, for example an alkali metal such as potassium or sodium, or a heavy metal such as nickel, copper or iron, is undesirable.

On the other hand, tungsten is a material utilized as an electrode material in semiconductor manufacturing apparatuses and does not cause a detrimental effect as an additive in the yttria sintered body of the invention.

In the yttria sintered body of the invention, tungsten is dispersed in the sintered body, or, stated differently, tungsten particles are scattered around the yttria crystals.

Therefore a strain and a thermal stress of the yttria crystal at a high temperature state are relaxed by the tungsten particles, whereby an excellent thermal shock resistance can be realized.

The thermal shock resistance is difficult to improve in a state where the tungsten particles are not well dispersed but coagulated.

In the invention, an amount of addition of tungsten is within a range of from 1 to 50% with respect to yttria.

In case of an amount of addition exceeding 50%, the sintered body is significantly deteriorated in the plasma resistance, and, when employed as a component member in a halogen plasma process apparatus, shows an increased particle generation by the degradation of such component member.

On the other hand, an amount of addition less than 1% scarcely improves the thermal shock resistance.

Also the yttria sintered body is a sintered material of dense having an open pore rate of 0.2% or less.

In case of an open pore rate exceeding 0.2%, the sintered body, when employed as a component member in a halogen plasma process apparatus, is exposed to corrosion by plasma concentrated in the vicinity of the pores, whereby the component member itself is etched and tends to generate particles.

Tungsten to be added preferably has an average particle size of 3 μm or less.

In case of an average particle size exceeding 3 μm, tungsten becomes a substance hindering the sintering, to hinder a dense formation of the sintered body and to result in a higher open pore rate. and when the sintered body is employed as a component member in a halogen plasma process apparatus, it tends to be subjected to an etching in the vicinity of pores by the plasma and to cause particle generation.

The yttria sintered body has an excellent thermal shock resistance, more specifically a thermal shock resistance by water submersion method of 200° C. or larger.

The thermal shock resistance by water submersion method means a limit temperature difference generating a crack, when a sintered body, heated to a predetermined temperature, is put into water. As an example, when a sintered body heated at 220° C. does not generate a crack when put into water of 20° C., the thermal shock resistance by water submersion method is 220° C. or larger.

The yttria sintered body of the invention, having a thermal shock resistance by water submersion method of 200° C. or larger, may be utilized as a component member of a plasma process apparatus in a high temperature range of 200° C. or higher, in which the yttria sintered body has not been usable.

More specifically, the sintered body, when employed as a component member of an apparatus for a halogen plasma process, can suppress generation of particles by a breakage or an etching of such member even under a high temperature of 200° C. or higher, and can contribute to an improvement in the production yield of semiconductor devices or the like to be produced.

In particular, it is advantageously usable, for example in a film forming process on a semiconductor wafer, as a member for an apparatus utilizing plasma gas of a halogen compound such as $CCl_4$, $BCl_3$, HBr, $CF_4$, $C_4F_8$, $NF_3$ or $SF_6$, or a highly corrosive self-cleaning $ClF_3$ gas, or as a member exposed to an etching by a strong sputtering plasma utilizing $N_2$ or $O_2$.

The yttria sintered body of the invention can be produced by adding tungsten powder to yttria powder, and sintering the mixture at a temperature of from 1700 to 2000° C. in a reducing atmosphere or in vacuum.

In case of a sintering temperature less than 1700° C., many pores remain in the sintered body, which thus cannot be made dense enough and tends to be etched in the vicinity of the pores, thus easily causing particle generation.

On the other hand, a sintering temperature exceeding 2000° C. results in excessively large crystal particles, thus undesirably deteriorating the strength.

EXAMPLES

In the following, one of embodiments of the present invention will be further clarified by examples, but the present invention is not limited by these examples.

Example 1-1

Raw material powder of yttria of a purity of 99.9% was formed into granules by a spray-dryer, and powder of tungsten (W) was added to the yttria powder in such a manner that a ratio of the tungsten relative to the yttria is ranging from 1% in terms of weight. For an example, the ratio of 1% is derived from a case where when weight of the tungsten is 1 (g) and weight of the yttria is 100 (g).

The granules were press molded by CIP (Cold Isostatic Press) method under a pressure of 1.5 t/cm², and an obtained molded article (φ280mm×30 mm) was sintered at 1800° C. in a hydrogen atmosphere to obtain an yttria sintered body.

On the obtained sintered body, an open pore rate was measured by an Archimedes method.

Also a thermal shock resistance was evaluated by the following water submersion method.

From the sintered body above, 30 test pieces of a size of 3 mm×4 mm×40 mm were prepared by a grinding process.

10 test pieces each were maintained at a predetermined temperature for 30 minutes or longer, and then submerged in a water tank for 5 minutes (temperature difference ΔT (° C.)=130, 170 or 200).

After water was wiped off, the samples were dried at 120° C. for 2 hours, then cooled to the room temperature and inspected for the cracks, utilizing a fluorescent flaw detection liquid.

The sintered body was subjected to a grinding process to prepare a plasma rectifying ring.

It was mounted in an RIE (Reactive Ion Etching) etching apparatus (used gases: $CF_4$, $O_2$) and used in an etching process of an 8-inch silicon wafer, and a number of particles of 0.3 μm or larger on the wafer was measured by a laser particle counter.

Results are shown in Table 1.

Examples 1-2 to 1-6 and Comparative Examples 1-1 to 1-5

Sintered bodies were prepared in the same manner as in Example 1, except that the tungsten (W) added to yttria was changed to the amounts shown for Examples 1-2 to 1-6 and Comparative Examples 1-1 to 1-5 in Table 1.

Each sintered ceramic was measured for an open pore rate and a volume resistivity in the same manner as in Example 1-1 and measurement on the number of particles of a wafer when it was made into plasma rectifying ring and evaluation for a production of particles of the wafer were also carried out.

The obtained results are summarized in Table 1.

TABLE 1

| | | W addition amount | open pore rate | thermal shock resistance ΔT/crack count | | | particle |
|---|---|---|---|---|---|---|---|
| | | (%) | (%) | 130° C. | 170° C. | 220° C. | (count) |
| Example | 1-1 | 1 | 0.06 | 0 | 0 | 0 | 18 |
| | 1-2 | 5 | 0.08 | 0 | 0 | 0 | 10 |
| | 1-3 | 10 | 0.08 | 0 | 0 | 0 | 14 |
| | 1-4 | 20 | 0.10 | 0 | 0 | 0 | 15 |
| | 1-5 | 40 | 0.15 | 0 | 0 | 0 | 26 |
| | 1-6 | 50 | 0.18 | 0 | 0 | 0 | 12 |
| Comparative Example | 1-1 | 0 | 0.07 | 3 | 10 | — | 10 |
| | 1-2 | 0.8 | 0.06 | 0 | 10 | — | 15 |
| | 1-3 | 10 | 0.21 | 0 | 0 | 0 | 42 |
| | 1-4 | 40 | 0.22 | 0 | 0 | 0 | 48 |
| | 1-5 | 55 | 0.18 | 0 | 0 | 0 | 40 |

As will be apparent from Table 1, the yttria sintered bodies, having an amount of addition of tungsten of which ratio of the tungsten relative to the yttria is ranging from 1 to 50% in terms of weight and having an open pore rate of 0.2% or less (Examples 1-1 to 1-6), did not show cracking in the evaluation of thermal shock resistance by water submersion method and were confirmed to have a superior thermal shock resistance.

Also the yttria bodies of Examples 1-1 to 1-6, when utilized as the plasma rectifying ring, suppressed the particle generation and are expected to provide an improvement in the production yield of the semiconductor devices or the like, prepared utilizing such sintered body as the member of the apparatus.

Examples 1-7 to 1-9 and Comparative Example 1-6

Sintered bodies were prepared in the same manner as in Example 1-1, except for employing tungsten (W) powder of particle sizes shown as Examples 1-7 to 1-9 and Comparative Example 1-6 in Table 2 and it was added in an amount 2% by weight based on yttria.

Each sintered ceramic was measured for an open pore rate and a density by an Archimedes method in the same manner as in Example 1-1. The number of particles of a wafer when the sintered ceramic was made into a plasma rectifying ring was also carried out.

The obtained results are summarized in Table 2.

TABLE 2

|  |  | W average particle size (μm) | density (g/cm³) | open pore rate (%) | particle (count) |
|---|---|---|---|---|---|
| Example | 1-7 | 0.5 | 5.102 | 0.06 | 16 |
|  | 1-8 | 1.2 | 5.050 | 0.06 | 13 |
|  | 1-9 | 2.8 | 4.963 | 0.19 | 32 |
| Comparative Example | 1-6 | 3.5 | 4.922 | 0.25 | 61 |

As will be apparent from Table 2, a dense sintered body was difficult to obtain when the added tungsten had an average particle size exceeding 3 μm, and the sintered body of Comparative Example 1-6 had an open pore rate exceeding 0.2%, and showed a larger particle generation when employed as the plasma rectifying ring.

In the following, another aspect of the present invention will be clarified in further details.

The yttria sintered body of the present invention is characterized in including tungsten, dispersed in an amount of from 1 to 50% with respect to the yttria, and having an open pore rate equal to or less than 0.2%.

Accordingly, adding tungsten having high melting point to yttria having plasma resistance allows reducing the volume resistivity.

Thus the sintered body of the present invention has an excellent resistance to corrosion by halogen plasma derived from fluorine or chlorine. Further, the volume resistivity thereof is adjustable by the amount of addition of the tungsten having high-melting point.

Therefore, such sintered body, when used as a component member of an apparatus to be used in a halogen plasma process, allows to suppress the generation of particles induced by the charging of the ceramics member and to maintain, in an etching process of a wafer or the like, a uniform etching rate over the wafer surface, whereby the production yield of the semiconductor chips or the like to be produced can be improved in comparison with the case of utilizing the prior insulating ceramics.

In the invention, an amount of addition of tungsten is within a range of from 1 to 50% with respect to yttria as described above.

When an amount of addition exceeds 50%, the sintered body is significantly deteriorated in the plasma resistance, and, when employed as a component member in a halogen plasma process apparatus, shows an increased particle generation by the degradation of such component member.

On the other hand, an amount of addition less than 1% scarcely reduces the volume resistivity.

Also the yttria sintered body is a sintered material of a dense texture, having an open pore rate equal to or less than 0.2%.

In case of an open pore rate exceeding 0.2%, the sintered body, when employed as a component member in a halogen plasma process apparatus, is exposed to corrosion by plasma concentrated in the vicinity of the pores, whereby the component member itself is etched and tends to generate particles.

Also the yttria sintered body preferably has a volume resistivity of $10^6$ Ω·cm or more and $10^{13}$ Ω·cm or less at temperature of 20 to 400° C.

When the volume resistivity is more than $10^{13}$ Ω·cm, the sintered ceramics member tends to be easily electrically charged and, when employed as a component member in a halogen plasma process apparatus, is difficult to suppress the particle generation. Also an ion sheath formed directly above the wafer becomes uneven to result in an uneven etching rate within the wafer surface.

On the other hand, when the volume resistivity less than $10^6$ Ω·cm, there cannot provide a sufficient insulating property, and cannot obtain the aforementioned effects of suppressing the particle generation and attaining a uniform etching rate.

The yttria sintered body of the invention can be produced by adding, to yttria powder, tungsten powder in an amount of from 1 to 50% with respect to the yttria, and sintering the mixture at temperature of from 1700 to 2000° C. in reducing atmosphere or in vacuum.

When sintering temperature is less than 1700° C., many pores remain in the sintered body, which thus cannot be made dense enough and cannot have a low volume resistivity as described above.

On the other hand, when sintering temperature exceeds 2000° C., it leads excessively large crystal particles, thus undesirably deteriorating the strength.

Examples

In the following, an embodiment of the present invention will be further clarified by examples, but the present invention is not limited by these examples.

Example 2-1

To raw material powder of yttria of a purity of 99.9%, powder of tungsten (W) was added in an amount of 5% with respect to the yttria, and the mixture was made into granules by a spray-dryer.

The granules were press molded by CIP (Cold Isostatic Pressure) method under a pressure of 1500 kgf/cm², and an obtained molded body (ϕ280mm×30 mm) was sintered at 1800° C. in a hydrogen atmosphere to obtain a sintered body.

On the obtained sintered body, an open pore rate was measured by an Archimedes method, and a volume resistivity was measured at room temperature (25° C.) by a four-terminal method and a double ring method.

Results of these measurements are shown in Table 3.

The sintered body was subjected to a grinding process to prepare a plasma rectifying ring.

It was mounted in an RIE (Reactive Ion Etching) etching apparatus (used gases: $CF_4$, $O_2$) and used in an etching process of an 8-inch silicon wafer, and a number of particles of 0.3 μm or larger on the wafer was measured by a laser particle counter.

Also chips (15 mm×7 mm) were prepared from the wafer, and a production yield of such chips was evaluated.

Results are shown in Table 3.

Examples 2-2 to 2-6 and Comparative Examples 2-1 to 2-6

Sintered bodies were prepared in the same manner as in Example 2-1, except that the tungsten (W) added to yttria was changed to the amounts shown for Examples 2-2 to 2-6 and Comparative Examples 2-1 to 2-6 in Table 3.

Each sintered ceramic was measured for an open pore rate and a volume resistivity in the same manner as in Example 2-1 and measurement on the number of particles of a wafer when it was made into plasma rectifying ring and evaluation for a production yield of chips were also carried out.

The obtained results are summarized in Table 3.

TABLE 3

|  |  | W addition amount (%) | open pore rate (%) | volume resistivity (Ω · cm) | particle (count) | chip yield (%) |
|---|---|---|---|---|---|---|
| Example | 2-1 | 5 | 0.05 | $7 \times 10^{12}$ | 18 | 90 |
|  | 2-2 | 10 | 0.06 | $3 \times 10^{12}$ | 10 | 96 |
|  | 2-3 | 20 | 0.08 | $2 \times 10^{10}$ | 14 | 92 |
|  | 2-4 | 30 | 0.08 | $9 \times 10^{8}$ | 15 | 90 |
|  | 2-5 | 40 | 0.12 | $9 \times 10^{6}$ | 26 | 90 |
|  | 2-6 | 48 | 0.11 | $2 \times 10^{6}$ | 12 | 91 |
| Comparative | 2-1 | 0 | 0.07 | $1 \times 10^{13}$ | 40 | 82 |
| Example | 2-2 | 0.1 | 0.06 | $1 \times 10^{13}$ | 39 | 80 |
|  | 2-3 | 10 | 0.26 | $9 \times 10^{11}$ | 42 | 76 |
|  | 2-4 | 35 | 0.22 | $1 \times 10^{9}$ | 48 | 72 |
|  | 2-5 | 48 | 0.22 | $7 \times 10^{5}$ | 40 | 80 |
|  | 2-6 | 50 | 0.30 | $7 \times 10^{5}$ | 44 | 80 |

As will be apparent from Table 3, the yttria sintered bodies, having an amount of addition of tungsten of from 1 to 50% with respect to yttria and having an open pore rate of 0.2% or less (Examples 2-1 to 2-6), were confirmed, when utilized as the plasma rectifying ring, to suppress the particle generation and to provide a production yield of 90% or higher, in the chips prepared from the processed wafer.

While there has been described in connection with the preferred embodiments of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. An yttria sintered body comprising yttria, and tungsten dispersed in the yttria in such a manner that a ratio of the tungsten relative to the yttria is ranging from 1 to 50% in terms of weight,
   wherein an open pore rate of the yttria sintered body is 0.2% or less and
   a thermal shock resistance of the yttria sintered body is 200° C. or more in a water submersion method.

2. The yttria sintered body according to claim 1, wherein the tungsten has an average particle size of 3 μm or less.

3. An yttria sintered body comprising yttria and tungsten dispersed the yttria in such a manner that a ratio of the tungsten relative to the yttria is ranging from 1 to 50% in terms of weight, wherein an open pore rate of the yttria sintered body is 0.2% or less.

4. The yttria sintered body according to claim 3, wherein a volume resistivity is $10^6$ Ω·cm or more and $10^{13}$ Ω·cm or less at 20 to 400° C.

* * * * *